United States Patent
Pan et al.

(10) Patent No.: US 11,600,709 B2
(45) Date of Patent: Mar. 7, 2023

(54) MEMORY CELL AND FABRICATING METHOD OF THE SAME

(71) Applicant: UNITED MICROELECTRONICS CORP., Hsin-Chu (TW)

(72) Inventors: Chih-Hao Pan, Kaohsiung (TW); Chi-Cheng Huang, Kaohsiung (TW); Kuo-Lung Li, Tainan (TW); Szu-Ping Wang, Tainan (TW); Po-Hsuan Chen, Tainan (TW); Chao-Sheng Cheng, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/853,954

(22) Filed: Jun. 30, 2022

(65) Prior Publication Data

US 2022/0336606 A1    Oct. 20, 2022

Related U.S. Application Data

(62) Division of application No. 17/219,829, filed on Mar. 31, 2021, now Pat. No. 11,417,742.

(30) Foreign Application Priority Data

Feb. 24, 2021 (CN) .......................... 202110207969.6

(51) Int. Cl.
*H01L 29/792* (2006.01)
*H01L 29/423* (2006.01)
*H01L 29/66* (2006.01)
*H01L 21/28* (2006.01)

(52) U.S. Cl.
CPC .. *H01L 29/42352* (2013.01); *H01L 29/40117* (2019.08); *H01L 29/66833* (2013.01); *H01L 29/792* (2013.01)

(58) Field of Classification Search
CPC ......... H01L 29/42352; H01L 29/40117; H01L 29/66833; H01L 29/792
See application file for complete search history.

(56) References Cited

U.S. PATENT DOCUMENTS

| | | | |
|---|---|---|---|
| 6,284,597 B1 | 9/2001 | Hong | |
| 6,913,969 B2 | 7/2005 | Yoo | |
| 6,963,108 B1 | 11/2005 | Kang | |
| 7,714,379 B2 | 5/2010 | Lee | |
| 7,910,453 B2 | 3/2011 | Xu | |
| 9,799,755 B2 | 10/2017 | Yang | |
| 10,707,316 B2 * | 7/2020 | Huang | ................ H01L 29/6656 |
| 2012/0181601 A1 | 7/2012 | Fang | |

* cited by examiner

*Primary Examiner* — Mohammad M Choudhry
(74) *Attorney, Agent, or Firm* — Winston Hsu

(57) ABSTRACT

A memory cell includes a substrate. A first STI and a second STI are embedded within the substrate. The first STI and the second STI extend along a first direction. An active region is disposed on the substrate and between the first STI and the second STI. A control gate is disposed on the substrate and extends along a second direction. The first direction is different from the second direction. A tunneling region is disposed in the active region overlapping the active region. A first trench is embedded within the tunneling region. Two second trenches are respectively embedded within the first STI and the second STI. The control gate fills in the first trench and the second trenches. An electron trapping stack is disposed between the tunneling region and the control gate.

9 Claims, 5 Drawing Sheets

MEMORY CELL AND FABRICATING METHOD OF THE SAME

CROSS REFERENCE TO RELATED APPLICATIONS

This application is a division of U.S. application Ser. No. 17/219,829, filed on Mar. 31, 2021. The content of the application is incorporated herein by reference.

BACKGROUND OF THE INVENTION

1. Field of the Invention

The present invention relates to a memory cell and a fabricating method of the same, and more particularly to a memory cell with an ONO stack structure having a larger width and a fabricating method of the same.

2. Description of the Prior Art

Semiconductor storage devices can generally be classified into volatile memory and non-volatile memory. Volatile memory loses its stored data when the power is turned off, while non-volatile memory keeps its stored data even when the power is turned off.

Flash memory is a type of non-volatile memory. Conventionally, flash memory can use floating gates to store charges. Another charge storage method is to store charges in the charge storage layer disposed between the channel and the gate. The charge storage layer is formed on the tunneling dielectric layer, and the tunneling dielectric layer separates the channel area in the semiconductor substrate from the charge storage layer. In addition, the dielectric insulating layer is formed on the charge storage layer and separates the charge storage layer from the gate.

As memory cells getting smaller, reducing the amount of variation between the bits stored in the memory cells becomes one of issues to be solved.

SUMMARY OF THE INVENTION

In view of this, the present invention provides a memory cell and a fabricating method to solve the above-mentioned problems.

According to a preferred embodiment of the present invention, a memory cell includes a substrate. A first shallow trench isolation (STI) and a second STI are embedded within the substrate, wherein the first STI and the second STI extend along a first direction. An active region is disposed on the substrate and between the first STI and the second STI. A control gate is disposed on the substrate and extends along a second direction, wherein the first direction is different from the second direction. A tunneling region is disposed in the active region which overlaps the control gate. A first trench is embedded within the tunneling region. Two second trenches are respectively embedded within the first STI and the second STI, wherein the control gate fills in the first trench and the second trenches. An electron trapping stack is disposed between the tunneling region and the control gate.

According to another preferred embodiment of the present invention, a fabricating method of a memory cell includes providing a substrate. A first STI and a second STI are embedded within the substrate. The first STI and the second STI extend along a first direction, wherein an active region is disposed on the substrate and between the first STI and the second STI, a pad oxide contacts the active region, the first STI contacts part of a top surface of the pad oxide, the second STI contacts part of the top surface of the pad oxide. Later, the pad oxide which is not covered by the first STI and by the second STI is removed to expose part of the active region. Next, a thermal process is performed to oxidize the active region exposed through the first STI and the second STI to form a silicon oxide layer. Subsequently, the silicon oxide layer, the pad oxide, part of the first STI and part of the second STI are removed to form a first trench within the active region, a second trench within the first STI and another second trench within the second STI. After that, an electron trapping stack is formed to fill the first trench, the second trenches and cover the active region. Finally, a control gate is formed to fill in the first trench, the second trenches, and cover the substrate, wherein the control gate extends along a second direction, and the first direction is different from the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of a memory cell according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
and
FIG. 6 is a fabricating stage following FIG. 5.

DETAILED DESCRIPTION

Figure 3:
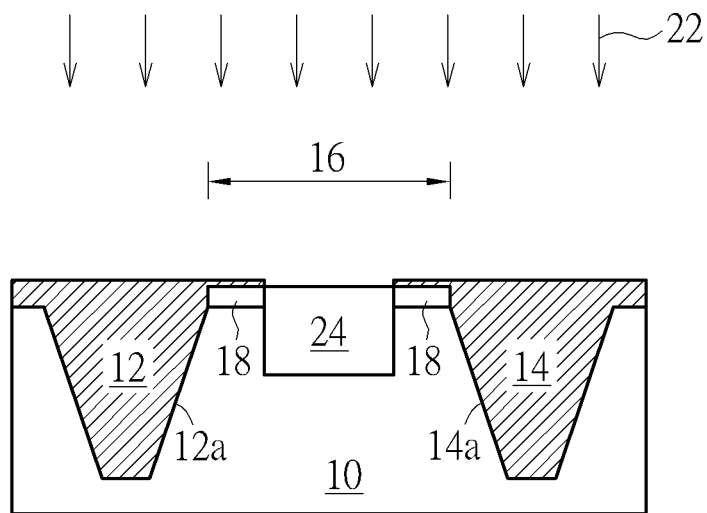
Figure 4:
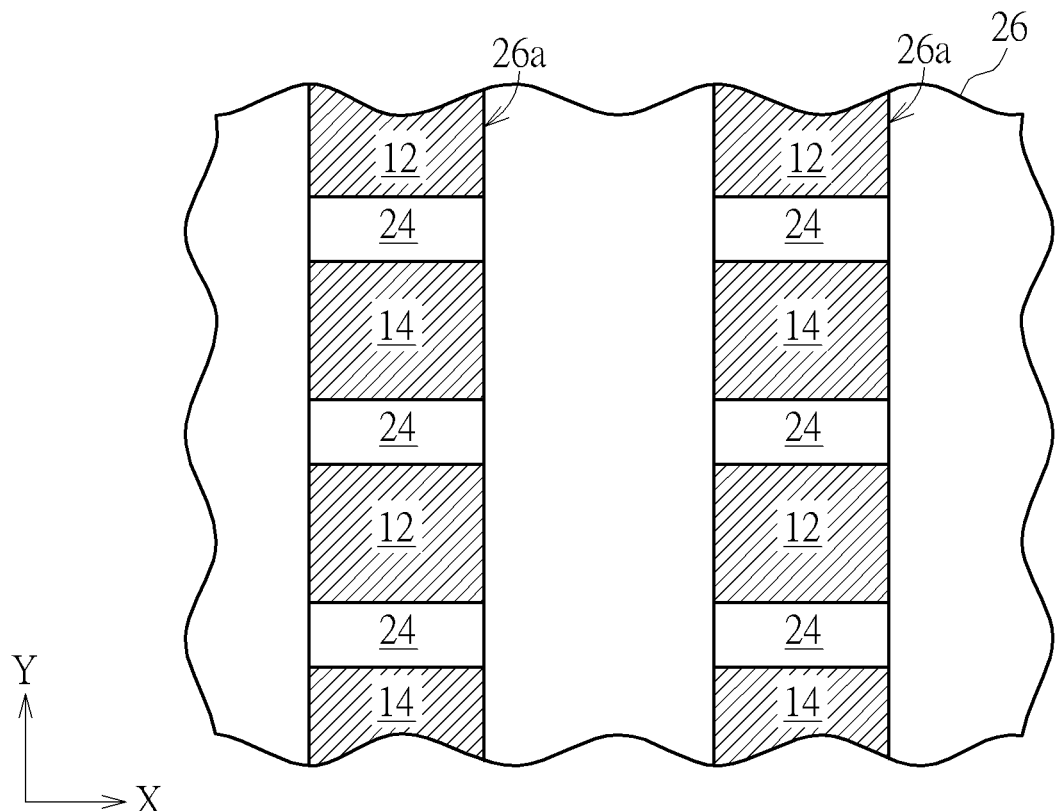

FIG. 1 to FIG. 6 depict a fabricating method of a memory cell according to a preferred embodiment of the present invention. FIG. 5A depicts a sectional view taken along line AA' in FIG. 5. FIG. 6A depicts a sectional view taken along line BB' in FIG. 6. FIG. 6B depicts a sectional view taken along line CC' in FIG. 6. FIG. 6C depicts a sectional view taken along line DD' in FIG. 6.

Figure 1:
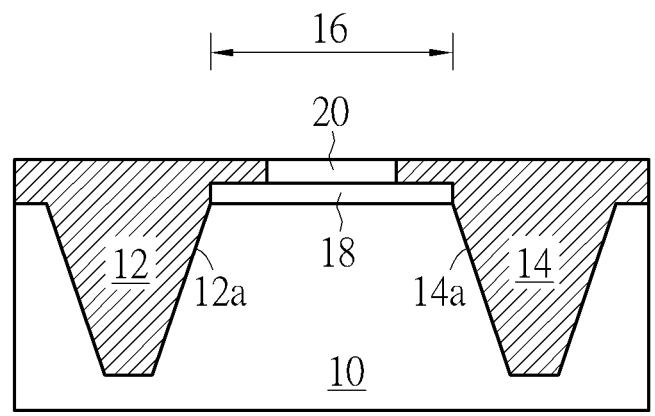
Figure 2:
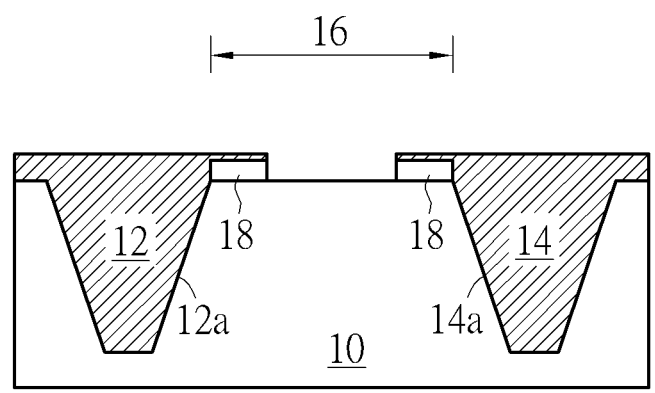

As shown in FIG. 1, a substrate 10 is provided. A first STI 12a and a second STI 14a are disposed within the substrate 10. The substrate 10 can be a silicon substrate or a silicon on insulator (SOI) substrate. An active region 16 is disposed on the substrate 10 and between the first STI 12a and the second STI 14a. A pad silicon oxide layer 18 covers and contacts a top surface of the active region 16. A pad silicon nitride layer 20 entirely covers and contacts the pad silicon oxide layer 18. Next, a wet etching process is performed to shorten the width of the pad silicon nitride layer 20 to expose two sides of the pad silicon oxide layer 18. Then, a filling layer is formed to fill in the first trench 12a and the second trench 14a to form a first STI 12 and a second STI 14. The filling layer not only fills in the first trench 12a and the second trench 14a, but also covers the pad silicon oxide layer 18. Therefore, part of the first STI 12 protrudes from the first trench 12a and contacts part of the top surface of the pad silicon oxide layer 18. Part of the second STI 14 protrudes from the second trench 14a and contacts part of the top surface of the pad silicon oxide layer 18. The top surface of the first STI 12, the top surface of the second STI 14 and the top surface of the pad silicon nitride layer 20 are aligned. It is noteworthy that the substrate 10 is immersed in the wet etching process for longer time comparing to the conventional process. The width of the pad silicon nitride layer 20 is shortened more comparing to a conventional silicon-oxide-nitride-oxide-silicon (SONOS). As shown in FIG. 2, the pad silicon nitride layer 20 is entirely removed to expose the pad silicon oxide layer 18. Later, the pad silicon oxide layer 18 which is not covered by the first STI 12 and the second STI 14 is removed to expose part of the active region 16.

As shown in FIG. 3, a thermal process 22 is performed to oxidize the active region 16 exposed from the first STI 12 and the second STI 14 to form a silicon oxide layer 24. FIG. 4 is continuous from FIG. 3. As shown in FIG. 4, a patterned mask 26 is performed to cover the substrate 10. The patterned mask 26 includes an opening 26a. The opening 26a defines a position of a control gate which will be formed afterward. The silicon oxide layer 24, the first STI 12 and the second STI 14 are exposed though the opening 26a. The first STI 12 and the second STI 14 extend along a first direction X. The opening 26a extends along a second direction Y. The first direction X is different from the second direction Y. In the present invention, the first direction X is perpendicular to the second direction Y, but not limited to it.

Figure 5:
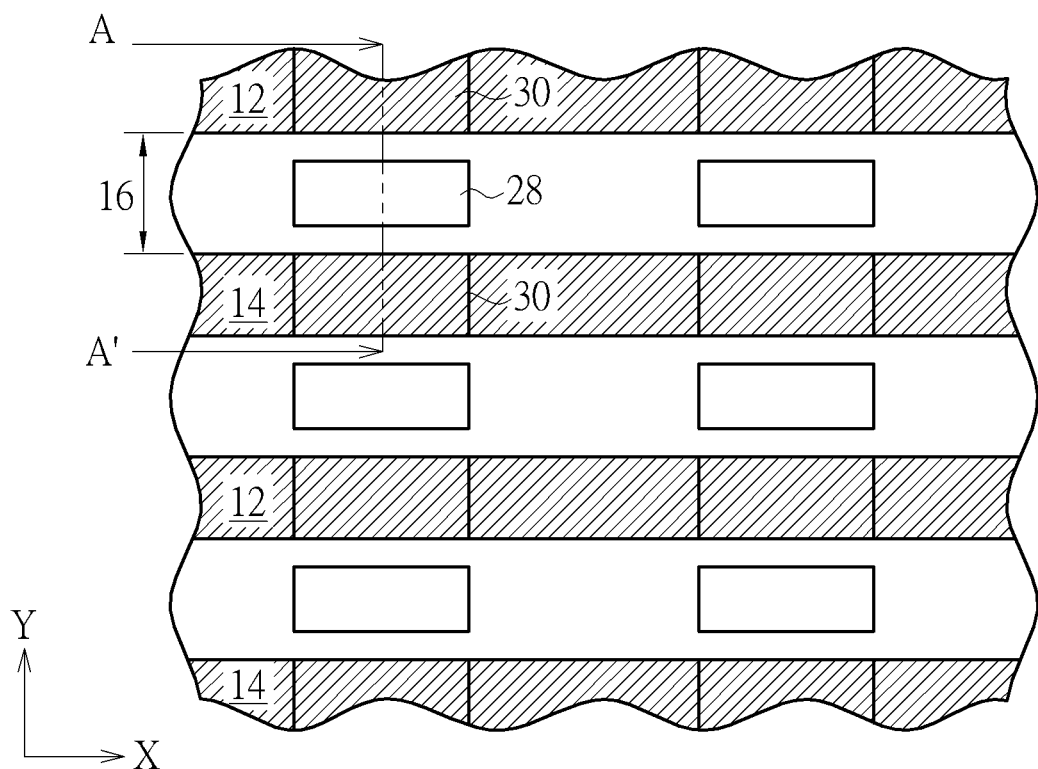
Figure 5A:
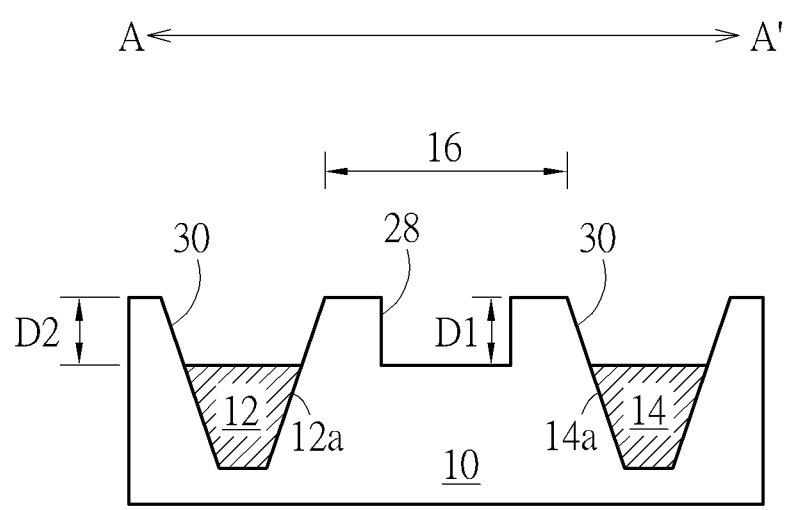
FIG. 5A depicts a sectional view taken along line AA' in FIG.

As shown in FIG. 5 and FIG. 5A, the silicon oxide layer 24, the pad silicon oxide layer 18, part of the first STI 12 and part of the second STI 14 are removed to form a first trench 28 within the active region 16, a second trench 30 within the first STI 12 and another second trench 30 within the second STI 14. In details, while the silicon oxide layer 24 is removed by the wet etching process, the top surface of the first STI 12 and the top surface of the second STI 14 are etched in a direction toward the substrate 10. When the silicon oxide layer 24 is entirely removed, the second trenches 30 respectively in the first STI 12 and second trench 14 are formed. The first trench 28 includes a first depth D1 disposed within the substrate 10. The second trenches 30 respectively within the first STI 12 and the second STI 14 include a second depth D2 in the substrate 10. The first depth D1 is the same as the second depth D2. However, in a different fabricating process, the first depth D1 can be different from the second depth D2. After the first trench 28 and the second trenches 30 are completed, the patterned mask 26 is removed.

Figure 6:
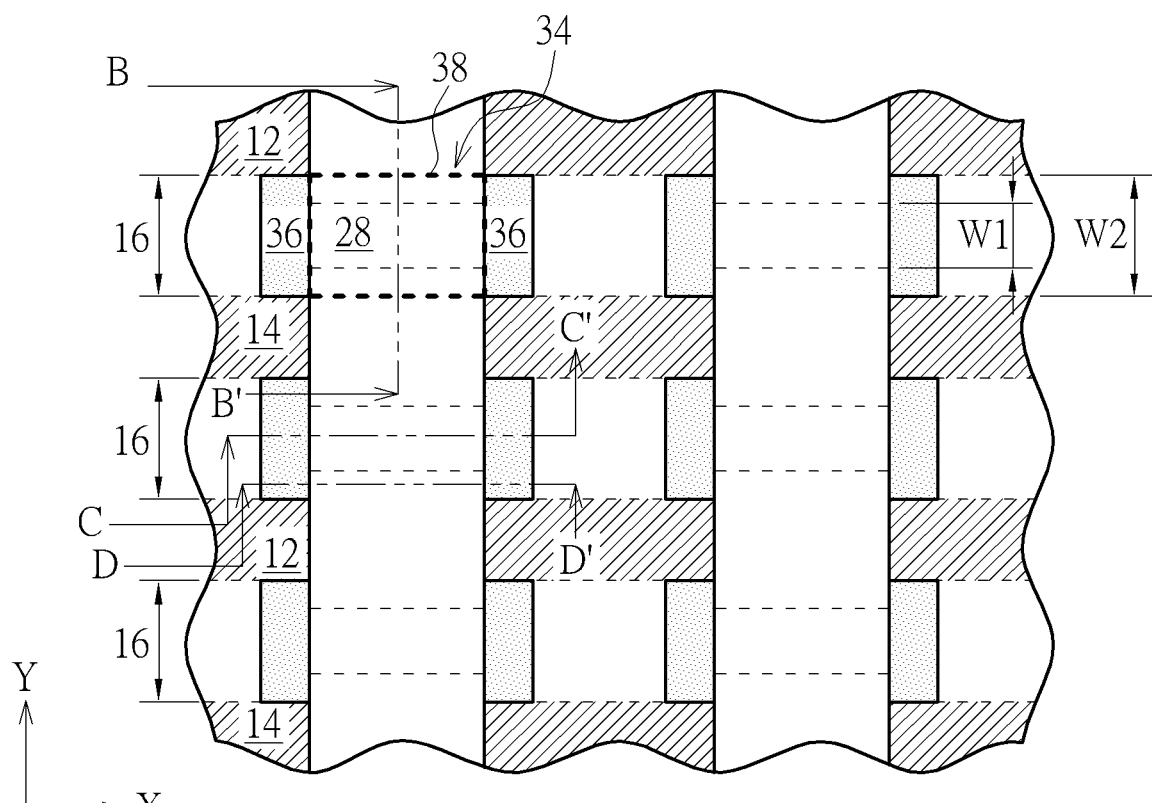
Figure 6A:
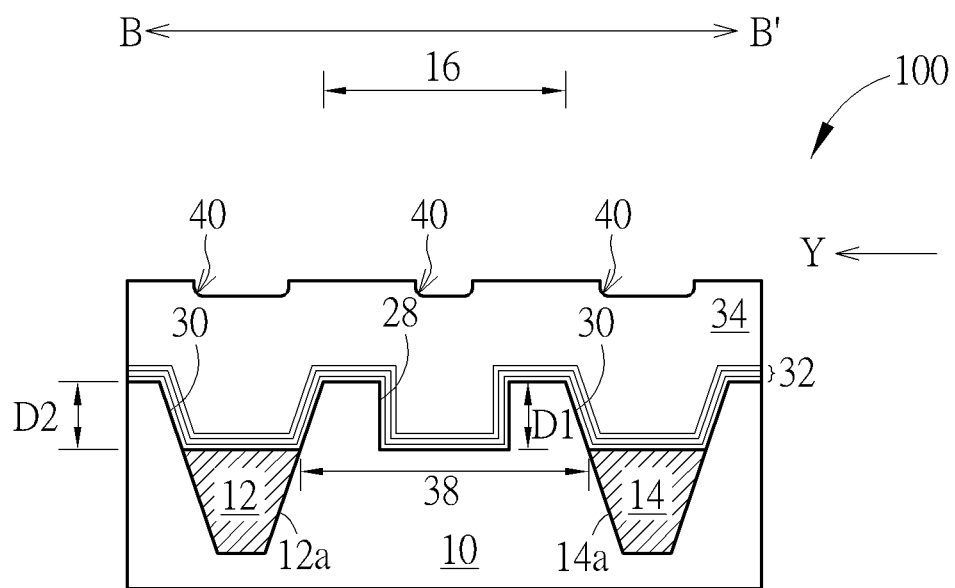
FIG. 6A depicts a sectional view taken along line BB' in FIG. 6.
Figure 6B:
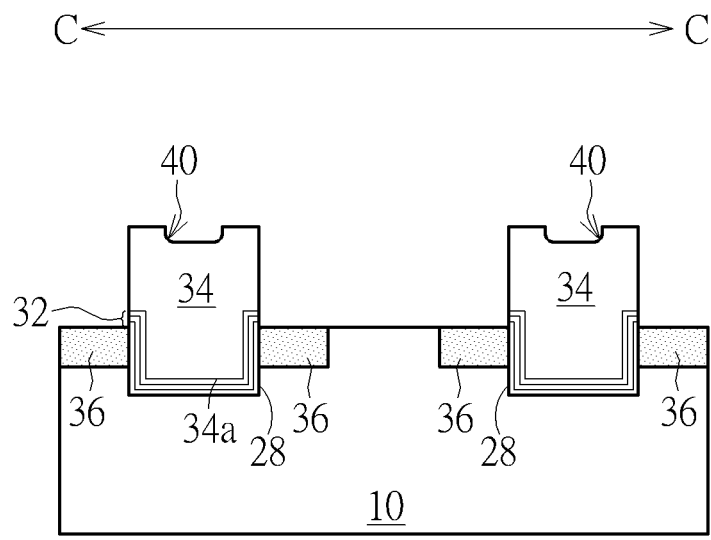
FIG. 6B depicts a sectional view taken along line CC' in FIG. 6.
Figure 6C:
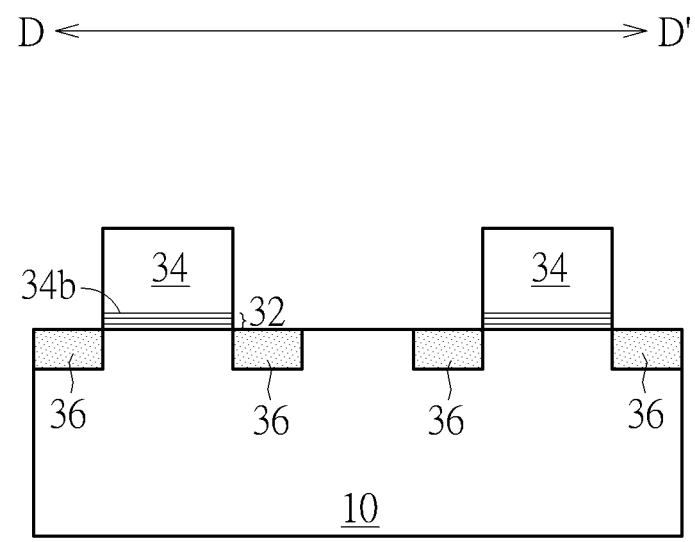
FIG. 6C depicts a sectional view taken along line DD' in FIG. 6.

As shown in FIG. 6 and FIG. 6A, an electron trapping stack 32 is formed to conformally fill in the first trench 28, the second trenches 30 and cover the active region 16, the first STI 12 and the second STI 14. The electron trapping stack 32 extend along the second direction Y. According to a preferred embodiment of the present invention, the electron trapping stack 32 is a stacked layer of silicon oxide-silicon nitride-silicon oxide. Later, a control gate 34 is formed to entirely overlap and cover the electron trapping stack 32. In addition, the control gate 34 extends along the second direction Y. The control gate 34 fills in the first trench 28 and the second trenches 30. Therefore, the top surface of the control gate 34 has a concave profile and a convex profile because of the shapes of the first trench 28 and the second trenches 30. Later, source/drain doping regions 36 are formed within the substrate 10 at two sides of the control gate 34. Now, an SONOS memory cell 100 of the present invention is completed.

As shown in FIG. 6, FIG. 6A, FIG. 6B and FIG. 6C, a memory cell 100 of the present invention includes a substrate 10. A first STI 12 and a second STI 14 are embedded within the substrate 10. The first STI 12 and the second STI 14 extend along a first direction X. An active region 16 is disposed on the substrate 10 and between the first STI 12 and the second STI 14. A control gate 34 is disposed on the substrate 10 and extends along a second direction Y. The first direction X is different from the second direction Y. A tunneling region 38 is disposed in the active region 16 which overlaps the control gate 34. A first trench 28 is embedded within the tunneling region 38. Two second trenches 30 are respectively embedded within the first STI 12 and the second STI 14. The control gate 34 fills in the first trench 28 and the second trenches 30. An electron trapping stack 32 is disposed between the tunneling region 38 and the control gate 34, between the first STI 12 and the control gate 34, and between the second STI 14 and the control gate 34. Two source/drain doping regions 36 are disposed within the active region 16 at two sides of the control gate 34. The electron trapping stack 32 is a stacked layer of silicon oxide-silicon nitride-silicon oxide. The silicon nitride serves as a charge storage layer. The silicon oxide serves as a tunneling dielectric and an insulating dielectric. The control gate 34 includes Al, Ti, Ta, W, Nb, Mo, Cu, TiN, TiC, TaN, Ti/W or Ti/TiN. The first STI 12 and the second STI 14 include silicon oxide. The substrate 10 can be a silicon substrate or an SOI substrate. The source/drain doping regions 36 can include P-type dopants or N-type dopants.

The first trench 28 includes a first width W1 extends along the second direction Y. The active region 16 includes a second width W2 extend along the second direction Y. The first width W1 is smaller than the second width W2. In other words, two sidewalls of the first trench 28 are made up by the substrate 10. The first trench 28 doesn't contact the first STI 12 and the second STI 14. The first trench 28 includes a first depth D1 disposed within the substrate 10. The second trenches 30 within first STI 12 and the second STI 14 respectively include a second depth D2 disposed within the substrate 10. According to a preferred embodiment of the present invention, the first depth D1 is the same as the second depth D2. That is, the first trench 28 is as deep as the second trenches 30, but not limited to this. In other cases, the first depth D1 can be different from the second depth D2.

Furthermore, the silicon oxide layer 24 is specially formed within the tunneling region 38. Later, by removing the tunneling region 38 the top surface of the tunneling region 38 is made to have a concave profile and two convex profiles. The concave profile is between the two convex profiles. Furthermore, the electron trapping stack 32 conformally covers the tunneling region 38; therefore, the concave profile and the convex profiles make the width of the electron trapping stack 32 larger along the second direction Y, comparing to a width of the electron trapping stack on the tunneling region with a flat top surface. More specifically speaking, because the electron trapping stack 32 fills in the first trench 28 conformally, the width of the electron trapping stack 32 become larger. According to a preferred embodiment of the present invention, the width of the electron trapping stack 32 along the second direction Y is increased 40% comparing to a width of the electron trapping stack of an SONOS memory cell without the first trench.

Moreover, along a direction perpendicular to the top surface of the substrate 10, the entire top surface of the control gate 34 is higher than the top surface of the substrate 10. Specially, the top surface of the control gate 34 in the first trench 28 is higher than the top surface of the substrate 10. In addition, the control gate 34 fills in the first trench 28 and the second trenches 30, the top surface of the control gate 34 in the first trench 28 and in the second trenches 30 forms concave profiles 40 because of the shape of the first trench 30 and the second trenches 30. The control gate 34 out of the first trench 28 and the second trenches 30 has a flat top surface. Furthermore, the control gate 34 in the first trench 28 has a first bottom 34a as shown in FIG. 6B. The control gate 34 on the active region 16 which surrounds the first trench 28 has a second bottom 34b as shown in FIG. 6C. With respective to the bottom of the substrate 10, the first bottom 34a is lower than the second bottom 34b.

Moreover, as shown in FIG. 6, in a memory array formed by numerous memory cells, the memory array has numerous first trenches 28. The first trenches 28 are arranged along the second direction Y.

A first trench 28 is disposed in the tunneling layer 38 of the memory cell 100 of the present invention. Therefore, a width of the electron trapping stack 32 along the extension direction of the control gate 34 is increased. That is, a channel width of the memory cell 100 is increased. In this way, the amount of variation between the bits stored in the memory cell 100 is decreased, errors in interpreting bits are reduced and durable time of the memory cell 100 improved. Moreover, as the electron trapping stack 32 in unit area is increased in the present invention; even the size of the memory cell 100 is reduced, the electron trapping stack 32 in unit area can be maintained at the same level. In addition, the first trench 28 is formed by only adding steps of oxidizing the substrate 10 to form the silicon oxide layer 24 and removing the silicon oxide layer 24. In other words, the first trench 28 is formed without adding any photo mask and can be compatible with the original fabricating process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a memory cell, comprising:
   providing a substrate, a first STI and a second STI embedded within the substrate, the first STI and the second STI extending along a first direction, wherein an active region is disposed on the substrate and between the first STI and the second STI, a pad oxide contacts the active region, the first STI contacts part of a top surface of the pad oxide, the second STI contacts part of the top surface of the pad oxide;
   removing the pad oxide which is not covered by the first STI and by the second STI to expose part of the active region;
   performing a thermal process to oxidize the active region exposed through the first STI and the second STI to form a silicon oxide layer;
   removing the silicon oxide layer, the pad oxide, part of the first STI and part of the second STI to form a first trench within the active region, and two second trenches respectively within the first STI and the second STI;
   forming an electron trapping stack filling the first trench, the second trenches and covering the active region; and
   forming a control gate filling in the first trench, the second trenches, and covering the substrate, wherein the control gate extends along a second direction, and the first direction is different from the second direction.

2. The fabricating method of the memory cell of claim 1, further comprising:
   forming two source/drain doping regions disposed within the active region at two sides of the control gate.

3. The fabricating method of the memory cell of claim 1, wherein the first trench comprises a first width extend along the second direction, the active region comprises a second width extend along the second direction, and the first width is smaller than the second width.

4. The fabricating method of the memory cell of claim 1, wherein the first trench comprises a first depth disposed within the substrate, the second trench comprises a second depth disposed within the substrate, and the first depth is the same as the second depth.

5. The fabricating method of the memory cell of claim 1, wherein the control gate within the first trench has a first bottom, the control gate within the active region which surrounds the first trench has a second bottom, the first bottom is lower than the second bottom with respective to a bottom of the substrate.

6. The fabricating method of the memory cell of claim 1, wherein a top surface of the control gate has a concave profile.

7. The fabricating method of the memory cell of claim 1, wherein the electron trapping stack comprises a stacked layer of silicon oxide-silicon nitride-silicon oxide.

8. The fabricating method of the memory cell of claim 1, wherein a top surface of the tunneling region comprises a concave profile and two convex profiles, and the concave profile is between the two convex profiles.

9. The fabricating method of the memory cell of claim 1, wherein a top surface of the control gate is higher than a top surface of the substrate along a direction perpendicular to the top surface of the substrate.

* * * * *